United States Patent
Jain et al.

(10) Patent No.: US 12,332,334 B2
(45) Date of Patent: Jun. 17, 2025

(54) SYSTEM AND METHOD FOR MULTI-SHOT VARIABLE AUTO-CALIBRATING RECONSTRUCTION FOR SINGLE CHANNEL DIFFUSION WEIGHTED MAGNETIC RESONANCE IMAGING USING LOW RANK

(71) Applicant: GE Precision Healthcare LLC, Wauwatosa, WI (US)

(72) Inventors: Nitin Jain, Damoh (IN); Ashok Kumar P Reddy, Bangalore (IN); Rajdeep Das, Kolkata (IN); Sajith Rajamani, Palakkad (IN); Rajagopalan Sundaresan, Bangalore (IN); Harsh Kumar Agarwal, Jaipur (IN); Ramesh Venkatesan, Bangalore (IN)

(73) Assignee: GE PRECISION HEALTHCARE LLC, Waukesha, WI (US)

( * ) Notice: Subject to any disclaimer, the term of this patent is extended or adjusted under 35 U.S.C. 154(b) by 219 days.

(21) Appl. No.: 18/318,489

(22) Filed: May 16, 2023

(65) Prior Publication Data
US 2024/0385274 A1 Nov. 21, 2024

(51) Int. Cl.
*G01V 3/00* (2006.01)
*G01R 33/56* (2006.01)
(Continued)

(52) U.S. Cl.
CPC ......... *G01R 33/58* (2013.01); *G01R 33/5608* (2013.01); *G01R 33/5616* (2013.01); *G01R 33/56341* (2013.01)

(58) Field of Classification Search
CPC .......... G01R 33/58; G01R 33/5608; G01R 33/5616; G01R 33/56341
(Continued)

(56) References Cited

U.S. PATENT DOCUMENTS

2019/0355157 A1* 11/2019 Daniel ............... G01R 33/5611

OTHER PUBLICATIONS

Reddy et al., "Multi-Shot Liver Diffusion MRI Using Variable Auto-Calibrating (vARC) Sampling Across Averages," https://submissions.mirasmart.com/ISMRM2022/ViewSubmission.aspx?sbmID=6377, 2022, 3 pgs.
(Continued)

*Primary Examiner* — Walter L Lindsay, Jr.
*Assistant Examiner* — Frederick Wenderoth
(74) *Attorney, Agent, or Firm* — Fletcher Yoder, P.C.

(57) ABSTRACT

A method includes obtaining k-space data acquired by an MRI scanner from a single channel body coil utilizing a multi-shot EP-DWI pulse sequence and sampling the k-space data for a plurality of shots so that for each shot both a central k-space is fully sampled to form a central calibration region and an outer k-space is partially sampled by a factor equal to a number of shots. The method includes reconstructing an initial fully sampled k-space estimate for each shot utilizing both partial Fourier constant sampling and projection on convex sets reconstruction, wherein the plurality of shots is treated as a plurality of channels for filling in missing k-space for a respective shot. The method includes utilizing a low-rank regularization algorithm in an iterative manner to generate a reconstructed image for each shot, wherein the initial fully sampled k-space estimate for each shot is utilized as an initial guess.

20 Claims, 8 Drawing Sheets

(51) Int. Cl.
*G01R 33/561* (2006.01)
*G01R 33/563* (2006.01)
*G01R 33/58* (2006.01)

(58) Field of Classification Search
USPC .......................................................... 324/309
See application file for complete search history.

(56) References Cited

OTHER PUBLICATIONS

Chu et al., "POCS-Based Reconstruction of Multiplexed Sensitivity Encoded MRI (POCSMUSE): A General Algorithm for Reducing Motion-Related Artifacts," Magnetic Resonance in Medicine, 2014, 13 pgs.
Hu et al., "Motion-robust reconstruction of multishot diffusion-weighted images without phase estimation through locally low-rank regularization," Magnetic Resonance in Medicine, 2018, 10 pgs.
Chen et al., "A robust multi-shot scan strategy for high-resolution diffusion weighted MRI enabled by multiplexed sensitivity-encoding (MUSE)," National Institute of Health, 2013, 15 pgs.
Brau et al., "Comparison of Reconstruction Accuracy and Efficiency Among Autocalibrating Data-Driven Parallel Imaging Methods," National Institute of Health, 2008, 28 pgs.
Binha et al., "Artifacts and Pitfalls in Diffusion MRI," Journal of Magnetic Resonance Imaging, vol. 24, 2006, 11 pgs.

\* cited by examiner

SYSTEM AND METHOD FOR MULTI-SHOT VARIABLE AUTO-CALIBRATING RECONSTRUCTION FOR SINGLE CHANNEL DIFFUSION WEIGHTED MAGNETIC RESONANCE IMAGING USING LOW RANK

BACKGROUND

The subject matter disclosed herein relates to medical imaging and, more particularly, to a system and method for multi-shot variable auto-calibrating reconstruction for single channel diffusion weighted magnetic resonance imaging (MRI) using low rank.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

Diffusion-weighted MRI (DWI) is widely used for routine clinical and neuroscientific applications. The DWI images are typically acquired with multi-channel receiving coils using single-shot or multi-shot echo-planar imaging (EPI). Fast-MRI techniques such as parallel imaging and partial-Fourier MRI are commonly used to reduce the amount of distortion in the EPI-DWI acquisition. Multi-shot acquisitions are used to acquire higher spatial resolution but these acquisitions are more prone to ghosting in the reconstructions due to motion-induced phase errors among the multi-shot excitations. There are many reconstruction techniques utilized for multi-shot DWI (e.g., multiplexed sensitivity-encoding (MUSE), projection onto convex sets (POCS)-MUSE, etc.). However, these reconstruction techniques are limited to multi-channel acquisitions.

Single channel DWI suffers from higher distortions, longer echo times, and unacceptable image quality due to $B_0$-inhomogeneity. Parallel imaging DWI can reduce distortion but parallel imaging cannot be used with single channel acquisition. Multi-shot single channel DWI acquisition can reduce distortion but it is not supported in product (e.g., MUSE) as aliasing in multi-shot single channel DWI cannot be resolved with product implementation. Therefore, only single-shot acquisition is currently possible for single channel DWI acquisition but it has lots of distortions, long echo time, and poor image quality.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for performing echo-planar diffusion weighted imaging (EP-DWI) is provided. The computer-implemented method includes obtaining, via a processor, k-space data of a region of interest acquired by a magnetic resonance imaging (MRI) scanner from a single channel body coil utilizing a multi-shot EP-DWI pulse sequence. The computer-implemented method also includes sampling, via the processor, the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI. The computer-implemented method further includes reconstructing, via the processor, an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction. The computer-implemented method even further includes utilizing, via the processor, a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

In another embodiment, a system for performing echo-planar diffusion weighted imaging (EP-DWI) is provided. The system includes a memory encoding processor-executable routines. The system also includes a processor configured to access the memory and to execute the processor-executable routines, wherein the processor-executable routines, when executed by the processor, cause the processor to perform actions. The actions include obtaining k-space data of a region of interest acquired by a magnetic resonance imaging (MRI) scanner from a single channel body coil utilizing a multi-shot EP-DWI pulse sequence. The actions also include sampling the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI. The actions further include reconstructing an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction. The actions even further include utilizing a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

In a further embodiment, a non-transitory computer-readable medium, the computer-readable medium including processor-executable code that when executed by a processor, causes the processor to perform actions. The actions include obtaining k-space data of a region of interest acquired by a magnetic resonance imaging (MRI) scanner from a single channel body coil utilizing a multi-shot echo-planar diffusion weighted imaging pulse sequence. The actions also include sampling the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI. The actions further include reconstructing an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction. The actions even further include utilizing a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
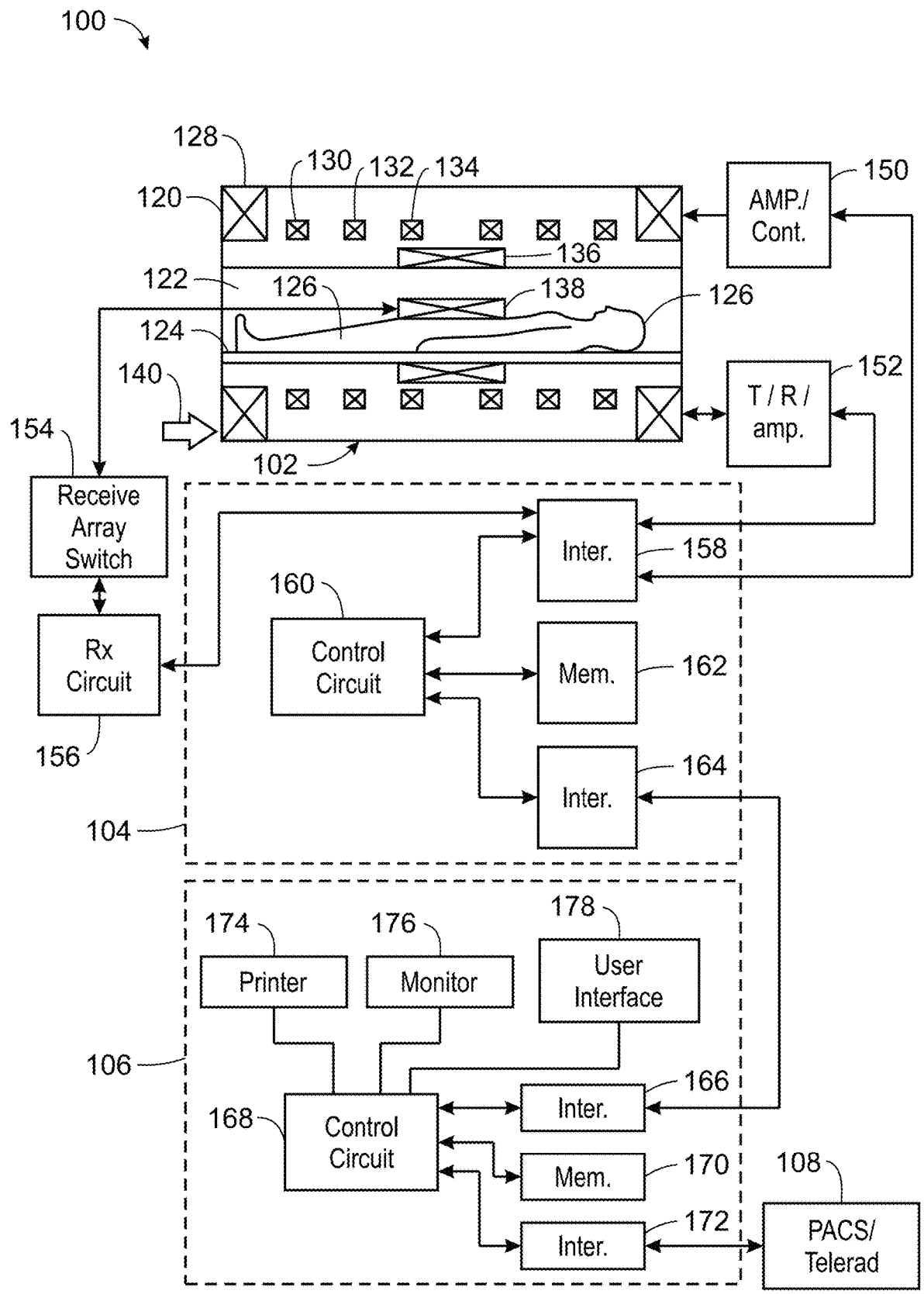
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides systems and methods performing echo-planar diffusion weighted imaging (EP-DWI). In particular, the systems and methods are configured to perform EP-DWI utilizing multi-shot variable auto-calibrating reconstruction for single channel diffusion weighted magnetic resonance imaging (MRI) using low rank. The disclosed embodiments include obtaining k-space data of a region of interest acquired by an MRI scanner from a single channel body coil (e.g., single channel radio frequency coil disposed about a body of the subject or patient) utilizing a multi-shot EP-DWI pulse sequence. The disclosed embodiments also include sampling (e.g., utilizing variable auto-calibrating reconstruction (vARC) acquisition) the k-space data for a plurality of shots so that for each shot of the plurality of shots both a central k-space is fully sampled to form a central calibration region (to serve as an in-line navigator) and an outer k-space is partially sampled in a phase encoding direction by a factor equal to a number of shots to be acquired. Shots are split phase encoding steps (e.g. sub-acquisitions) or samples acquired in the same sequence repetition that are contiguous in k-space (e.g., for an entire two-dimensional plane). During sampling of the k-space data for the plurality of shots a subsampling pattern is shifted across the plurality of shots. In certain embodiments, during sampling of the k-space data for the plurality of shots a width of the central calibration region varies across the plurality of shots. In certain embodiments, instead of the central calibration region of the k-space for every shot being acquired as part of the k-space traversal, it may be acquired externally as a gradient echo navigator or a spin echo navigator.

The disclosed embodiments further include reconstructing an initial fully sampled k-space estimate for each shot of the plurality of shots utilizing partial Fourier constant sampling and autocalibrating reconstruction for Cartesian imaging (ARC) and projection on convex sets (POCS) reconstruction. During reconstruction of the fully sampled k-space estimates, the plurality of shots is treated as a plurality of channels for filling in missing k-space for a respective shot. Interleaved shot k-space is filled with ARC. In ARC, a 3D kernel is utilized to synthesize missing data taking into account neighboring source data from all three directions. The partial Fourier k-space is filled utilizing POCS reconstruction. In certain embodiments, a partial Fourier factor is greater than the factor (i.e., the factor required to include the central calibration region). In certain embodiments, shots acquired over a plurality of excitations or acquisitions in which multiple shots are acquired (as sub-acquisitions) during each excitation in a plurality of diffusion directions may also be utilized to fill in the missing k-space for a respective shot. In certain embodiments, reconstructing the initial fully sampled k-space estimate for each shot includes utilizing the central calibration region for a respective shot and a weighted combination of neighboring k-space for the plurality of shots to fill in missing k-space in the respective shot. The central calibration region is utilized to determine weights for the weighted combination for the respective shot.

The disclosed embodiments even further include utilizing a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess. The disclosed embodiments include obtaining the k-space data of the region of interest and sampling the k-space data includes obtaining the k-space data and sampling the k-space data over a plurality of excitations (i.e., a number of excitations (NEX) or number of signal averages per acquisition) in which multiple shots will be acquired during each excitation and in a plurality of diffusion directions. In certain embodiments, the shots from different excitations in the same plane and the shots from different diffusion directions may be utilized in both reconstructing an initial fully sampled k-space estimate for each shot and utilizing a low-rank regularization algorithm in an iterative manner to generate a reconstructed image for each shot. The disclosed embodiments include generating a diffusion-weighted echo-planar image for the region of interest by combining a plurality of reconstructed images generated by the low-rank regularization algorithm from the plurality of shots over the plurality of excitations and in the plurality of diffusion directions.

The disclosed embodiments provide vARC sampling in single channel diffusion weighted imaging acquisition. The vARC sampling reduces distortion due to subsampled k-space acquisition and improves signal-to-noise ratio (via reduction in time to echo (TE) when the central calibration region is smaller than the partial Fourier sampling region). The vARC sampling also enables multi-shot data combination without aliasing due to the fully sampled central k-space. The vARC sampling is robust due to the outer subsampling pattern being shifted across shots. Also, vARC image reconstruction along with the shot low-rank regularization module operates at a smaller matrix size and produces good quality images where typical low-rank regularization methods cannot be applied due to random matrix theory related approximations. Further, vARC can be utilized with produce reverse polarity gradient (RPG) to further reduce distortion.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102, the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
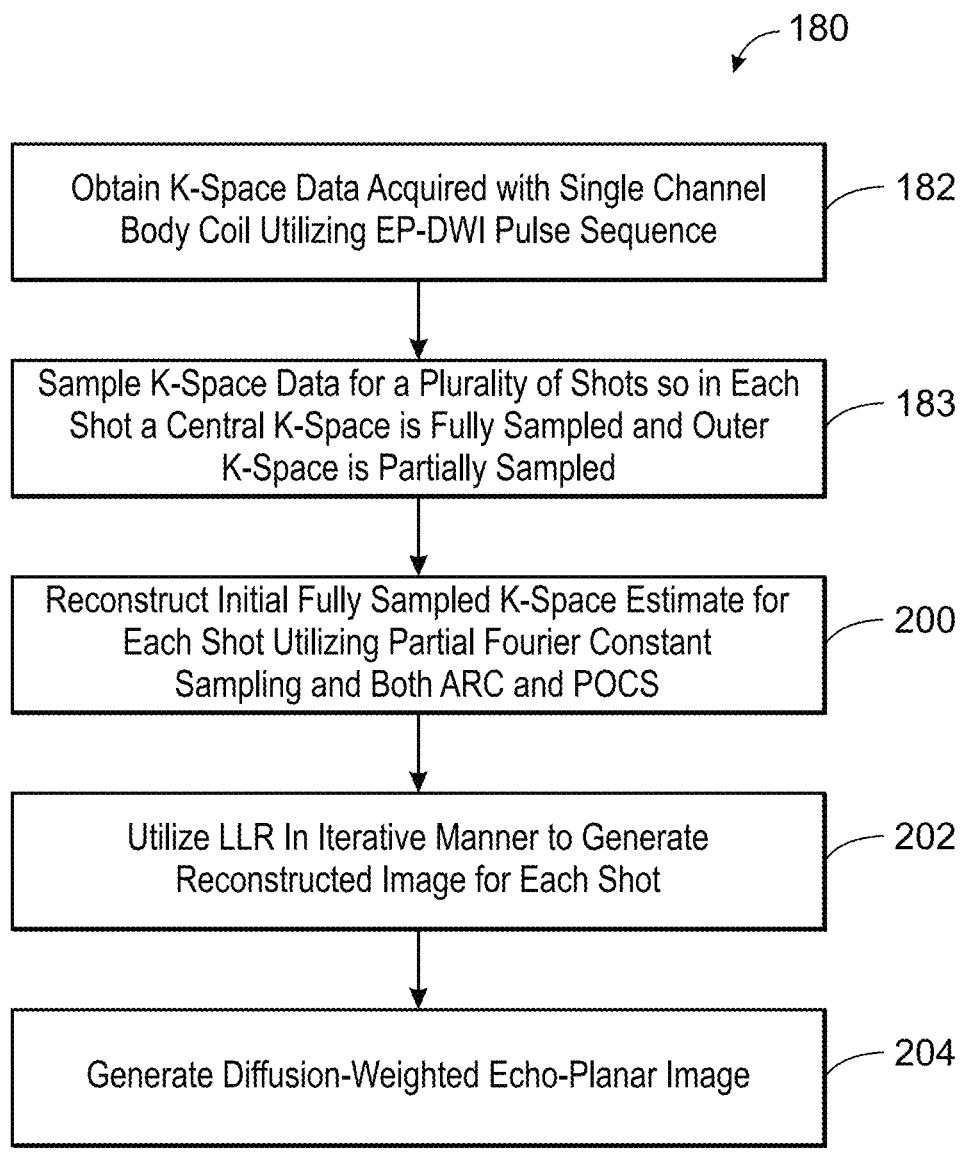
FIG. 2 illustrates a flow chart of a method for performing echo-planar diffusion weighted imaging (EP-DWI) (e.g., utilizing a single channel body coil), in accordance with aspects of the present disclosure.

FIG. 2 illustrates a flow chart of a method 180 for performing echo-planar diffusion weighted imaging (EP-DWI) (e.g., utilizing a single channel body coil). One or more steps of the method 180 may be performed by processing circuitry of the magnetic resonance imaging system 100 in FIG. 1 or a remote computing system. One or more of the steps of the method 180 may be performed simultaneously or in a different order from the order depicted in FIG. 2. In certain embodiments, the reconstruction technique in the method 180 can be utilized with multi-channel data. With multi-channel data, channel sensitivity maps are used in obtaining the reconstructions.

The method 180 includes obtaining k-space data of a region of interest acquired by an MRI scanner from a single channel body or volume coil (e.g., single channel radio frequency coil disposed about a body of the subject or patient such as RF receiving coil 138 in FIG. 1) utilizing a multi-shot EP-DWI pulse sequence (block 182). The method 180 also includes sampling (e.g., utilizing variable autocalibrating reconstruction (vARC) acquisition which a self-calibrated parallel imaging) the k-space data for a plurality of shots so that for each shot of the plurality of shots both a central k-space is fully sampled to form a central calibration region (to server as in-line navigator) and an outer k-space is partially sampled in a phase encoding direction by a factor (e.g., acceleration factor) equal to a number of shots of the plurality of shots (block 183). The number of shots acquired may vary. Shots are split phase encoding steps (e.g. sub-acquisitions) or samples acquired in the same sequence repetition that are contiguous in k-space (e.g., for an entire two-dimensional plane). During sampling of the k-space data for the plurality of shots a subsampling pattern is shifted across the plurality of shots. In certain embodiments, during sampling of the k-space data for the plurality of shots a width of the central calibration region varies across the plurality of shots to control distortion in the EP-DWI. In certain embodiments, obtaining the k-space data of the region of interest and sampling the k-space data includes obtaining the k-space data and sampling the k-space data over a plurality of excitations (i.e., a number of excitations (NEX) or number of signal averages per acquisition) in which multiple shots will be acquired during each excitation and in a plurality of diffusion directions.

Figure 3:
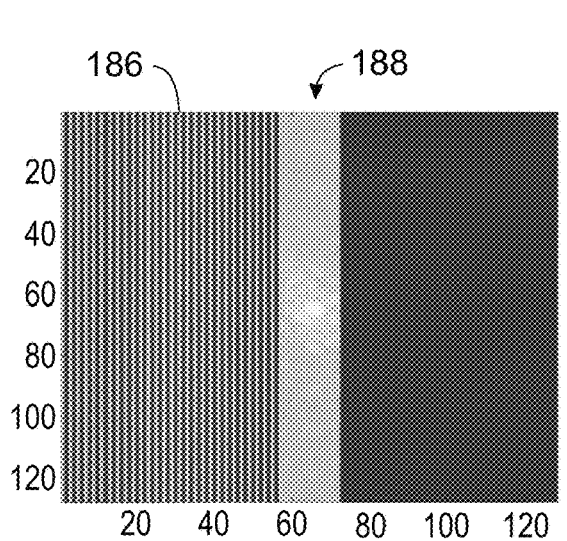
FIG. 3 illustrates k-space acquired utilizing multi-shot variable auto-calibrating reconstruction (vARC) (e.g., for 2 shots with 8 calibration lines from central k-space (acquired on opposite sides) and partial Fourier factor matching the calibration lines), in accordance with aspects of the present disclosure.
Figure 4:
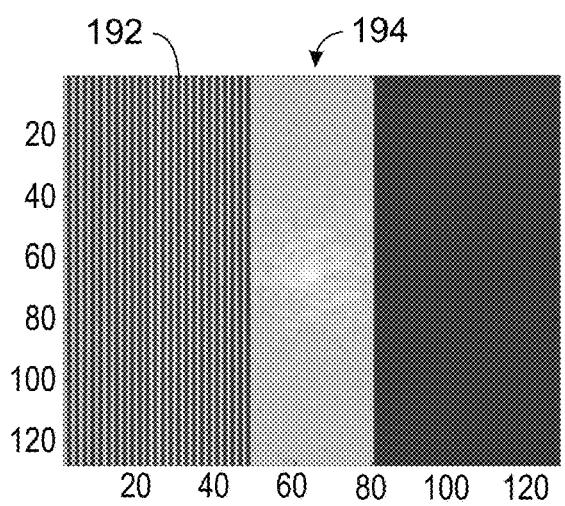
FIG. 4 illustrates k-space acquired utilizing multi-shot variable auto-calibrating reconstruction (vARC) (e.g., for 2 shots with 16 calibration lines from central k-space (acquired on opposite sides) and partial Fourier factor matching the calibration lines), in accordance with aspects of the present disclosure.
Figure 5:
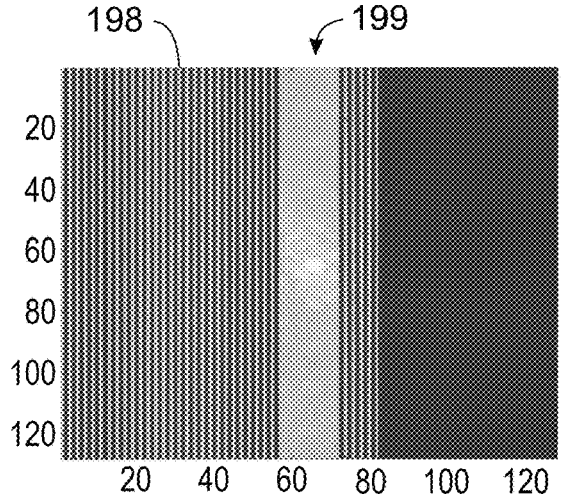
FIG. 5 illustrates k-space acquired utilizing multi-shot variable auto-calibrating reconstruction (vARC) (e.g., for 2 shots with 8 calibration lines from central k-space (acquired on opposite sides) and partial Fourier factor greater than the calibration lines), in accordance with aspects of the present disclosure.

FIGS. 3-5 are examples of the k-space acquired with multi-shot vARC. In FIG. 3, k-space 184 includes a number of lines or echoes 186 stacked together with unacquired data points filled with zeros. The k-space 184 was acquired from 2 shots. Each shot includes 8 calibration lines from central k-space (acquired on opposite sides). Thus, the k-space 184 includes 16 calibration lines forming a central calibration region 188 and other lines in the partially sampled outer k-space to one side of the central calibration region 188. The partial Fourier (PF) factor for the k-space 184 is 16 which matches the number of calibration lines. In FIG. 4, k-space 190 includes a number of lines or echoes 192 stacked together with unacquired data points filled with zeros. The k-space 190 was acquired from 2 shots. Each shot includes 16 calibration lines from central k-space (acquired on opposite sides). Thus, the k-space 190 includes 32 calibration lines forming a central calibration region 194 and other lines in the partially sampled outer k-space to one side of the central calibration region 194. The PF factor for the k-space 190 is 32 which matches the number of calibration lines. In FIG. 4, k-space 196 includes a number of lines or echoes 198 stacked together with unacquired data points filled with zeros. The k-space 196 was acquired from 2 shots. Each shot includes 8 calibration lines from central k-space (acquired on opposite sides). Thus, the k-space 196 includes 16 calibration lines forming a central calibration region 199 and other lines in the partially sampled outer k-space on both sides of the central calibration region 199. The PF factor for the k-space 196 is greater than the number of calibration lines (i.e., greater than 16). In a preferred embodiment, the PF factor is greater than acceleration factor required to include the central calibration region. The vARC sampling pattern has a lower echo time when the central calibration region is smaller than the partial Fourier sampling region.

Returning to FIG. 2, the method 180 includes reconstructing an initial fully sampled k-space estimate for each shot of the plurality of shots utilizing partial Fourier constant sampling and both autocalibrating reconstruction for Cartesian imaging (ARC) and projection on convex sets (POCS) reconstruction (block 200). During reconstruction of the initial fully sampled k-space estimates, the plurality of shots is treated as a plurality of channels for filling in the missing k-space for a respective shot. Interleaved shot k-space is filled with ARC. In ARC, a 3D kernel is utilized to synthesize missing data taking into account neighboring source data from all three directions. The partial Fourier k-space is filled utilizing POCS reconstruction. In certain embodiments, as noted above, a PF factor is greater than the acceleration factor (i.e., the factor required to include the central calibration region). In certain embodiments, reconstructing the initial fully sampled k-space estimate for each shot includes utilizing the central calibration region for a respective shot and a weighted combination of neighboring k-space for the plurality of shots to fill in the missing k-space in the respective shot. The central calibration region is utilized to determine weights for the weighted combination for the respective shot.

The method 180 also includes utilizing a low-rank regularization algorithm (e.g., shot locally low-rank regularization algorithm (shot-LLR)) in an iterative manner to generate a reconstructed image for each shot of the plurality of shots (block 202). The plurality of shots is inputted into the low-rank regularization algorithm. In addition, the initial fully sampled k-space estimates for the plurality of shots is inputted into the low-rank regularization algorithm. The initial fully sampled k-space estimate for each shot of the plurality of shots is utilized by the low-rank regularization algorithm as an initial guess. In certain embodiments, each iteration of the low rank approach first applies low rank in a small neighborhood (e.g., kernel size=5×5) across all shots followed by data consistency to match the acquired k-space with accuracy. The vARC central calibration region helps in getting k-space filled with the right phase, which can be difficult in plain multi-shot or external navigator acquisitions. In particular, the vARC-LLR approach does not require explicit estimations of the phase maps, instead, it relies on converting smooth phase-modulations between shots as null space vectors of a structured matrix. The unacquired data points in the original k-space are filled in using locally low rank algorithm applied on structured shot matrix iteratively with of support of the initial k-space subject (i.e., the initial fully sampled k-space estimates) subject data consistency.

As noted above, obtaining the k-space data of the region of interest and sampling the k-space data may include obtaining the k-space data and sampling the k-space data over a plurality of excitations or acquisitions in which multiple shots may be acquired (as sub-acquisitions) during each excitation and in a plurality of diffusion directions. In certain embodiments, the shots from different excitations or acquisitions in the same plane and the shots from different diffusion directions may be utilized in both reconstructing an initial fully sampled k-space estimate for each shot and utilizing a low-rank regularization algorithm in an iterative manner to generate a reconstructed image for each shot. The method 180 further includes generating a diffusion-weighted echo-planar image of the region of interest by combining a plurality of reconstructed images generated by the low-rank regularization algorithm from the plurality of shots over the plurality of excitations and in the plurality of diffusion directions (block 204).

Figure 6:
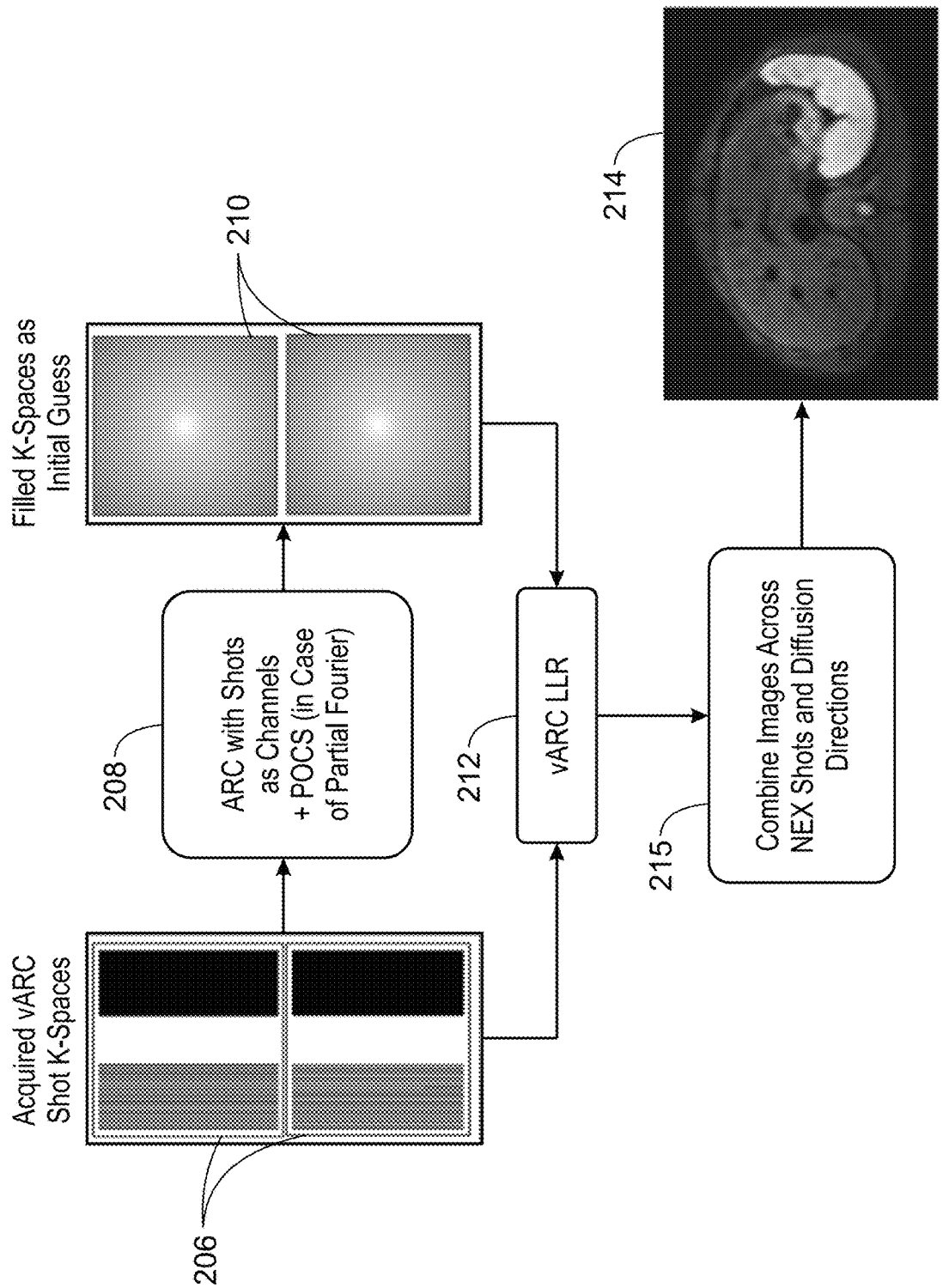
FIG. 6 illustrates a schematic diagram of the method in FIG. 2, in accordance with aspects of the present disclosure.

FIG. 6 illustrates a schematic diagram of the method 180 in FIG. 2. As depicted in FIG. 6, k-space data is obtained of a region of interest acquired by an MRI scanner from a single channel body coil (e.g., single channel radio frequency coil disposed about a body of the subject or patient such as RF receiving coil 138 in FIG. 1) utilizing a multi-shot EP-DWI pulse sequence and sampled (e.g., utilizing vARC acquisition) for a plurality of shots 206 so that for each shot 206 of the plurality of shots 206 both a central k-space is fully sampled to form a central calibration region (to serve as in-line navigator) and an outer k-space is partially sampled in a phase encoding direction by a factor (e.g., acceleration factor) equal to a number of shots 206 of the plurality of shots 206. As depicted in FIG. 6, the number of shots 206 is two. During sampling of the k-space data for the plurality of shots 206 a subsampling pattern is shifted across the plurality of shots 206. During sampling of the k-space data for the plurality of shots 206 a width of the central calibration region varies across the plurality of shots 206.

The shots 206 are subjected to reconstruction utilizing partial Fourier constant sampling and ARC and POCS reconstruction (as indicated by reference numeral 208) to generate an initial fully sampled k-space estimate 210 for each shot 206. As depicted in FIG. 6, there are two initial fully sampled k-space estimates 210 corresponding to the two shots 206. During reconstruction of the initial fully sampled k-space estimates 210, the plurality of shots 206 is treated as a plurality of channels for filling in the missing k-space for a respective shot 206. Interleaved shot k-space is filled with ARC. In ARC, a 3D kernel is utilized to synthesize missing data taking into account neighboring source data from all three directions. The partial Fourier k-space is filled utilizing POCS reconstruction. The partial Fourier k-space is filled using POCS reconstruction. In certain embodiments, as noted above, a PF factor is greater than the acceleration factor (i.e., the factor required to include the central calibration region). In certain embodiments, reconstructing the initial fully sampled k-space estimate 210 for each shot 206 includes utilizing the central calibration region for a respective shot 206 and a weighted combination of neighboring k-space for the plurality of shots 206 to fill in the missing k-space in the respective shot 206. The central calibration region is utilized to determine weights for the weighted combination for the respective shot 206.

The shots 206 and the initial fully sampled k-space estimates 210 are inputted into a low-rank regularization algorithm 212 (e.g., shot locally low-rank regularization algorithm (shot-LLR)). The low-rank regularization algorithm 212 in an iterative manner generates a reconstructed image for each shot 206. The initial fully sampled k-space estimate 210 for each shot 206 is utilized by the low-rank regularization algorithm 212 as an initial guess.

As noted above, obtaining the k-space data of the region of interest and sampling the k-space data includes obtaining the k-space data and sampling the k-space data over a plurality of excitations or acquisitions in which multiple shots 206 are acquired (as sub-acquisitions) during each excitation and in a plurality of diffusion directions. As depicted in FIG. 6, a diffusion-weighted echo-planar image 214 of the region of interest is generated by combining a plurality of reconstructed images generated by the low-rank regularization algorithm 212 from the plurality of shots 206 over the plurality of excitations and in the plurality of diffusion directions as indicated by reference numeral 215.

Figure 7:
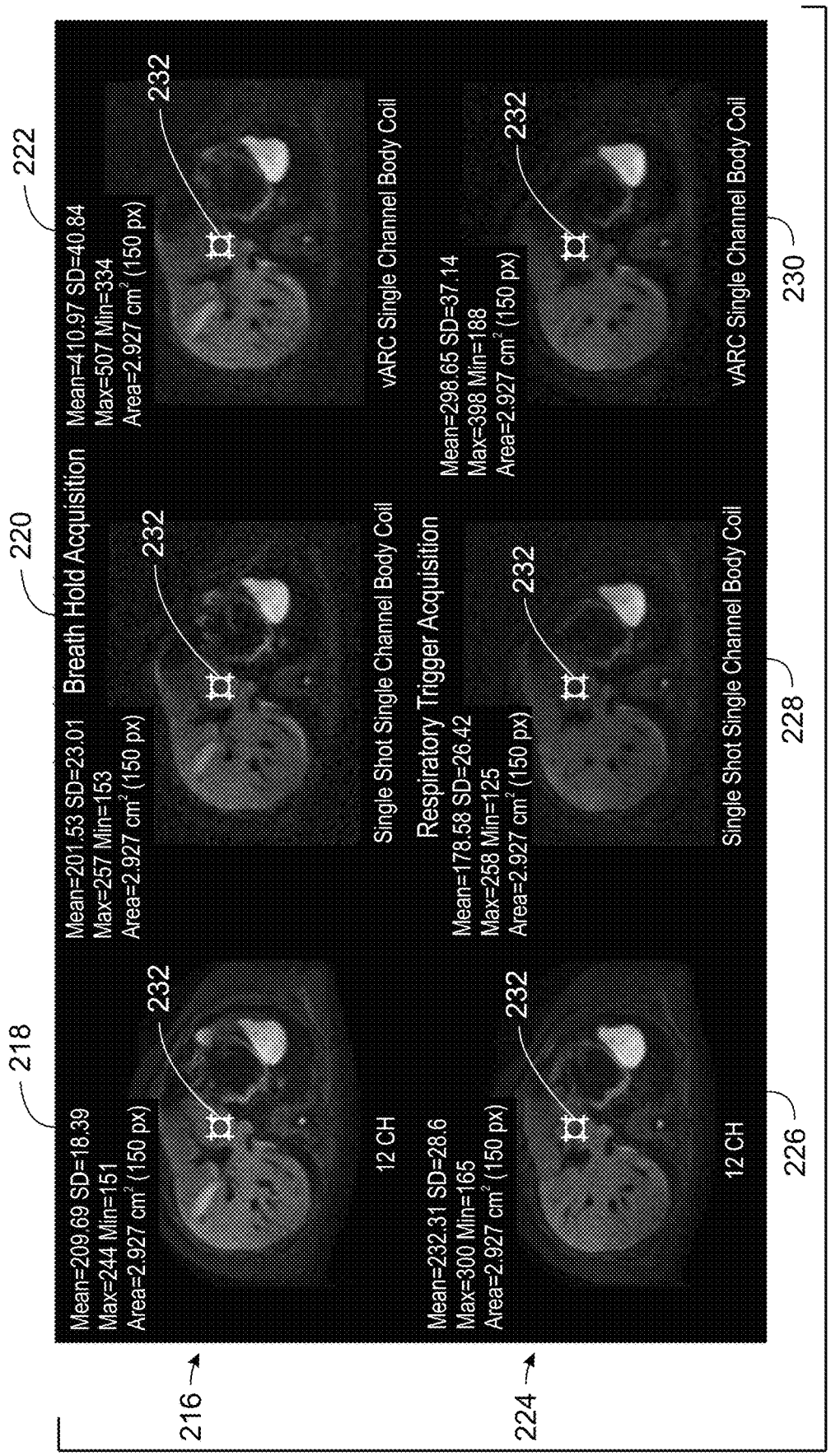
FIG. 7 depicts MRI images acquired of an abdomen of a subject utilizing different techniques including vARC and low rank reconstruction.

FIG. 7 depicts MRI images acquired of an abdomen of a subject utilizing different techniques including vARC and low rank reconstruction. The MRI images were acquired utilizing a 1.5 Tesla (T) MRI scanner. The MRI images were acquired utilizing EPI-DWI pulse sequence. The MRI images were acquired utilizing either a surface coil or a body coil. The MRI images are of a slice with a B-value equaling 500 s/mm$^2$ for DWI MRI. A top row 216 includes MRI images 218, 220, and 222. The MRI images 218, 220, and 222 were acquired utilizing a breath hold acquisition. A bottom row 224 includes MRI images 226, 228, and 230. The MRI images 226, 228, and 230 were acquired utilizing a respiratory trigger acquisition. The MRI images 218 and 226 were acquired with a 12-channel surface coil utilizing parallel imaging with an acceleration factor of 2. The MRI images 220 and 228 were acquired utilizing a single shot and a single channel body (or volume) coil. The MRI images 222 and 230 were acquired utilizing vARC acquisition with a shot factor of 2 (and reconstructed utilizing LLR reconstruction) and a single channel body (or volume) coil. The MRI images 222 and 230 were acquired utilizing vARC sampling of 32 calibration lines. The DWI of the abdomen has a field of view of 24 centimeters (cm)×24 cm and a matrix size of 256×256. The scan times are similar in all scenarios. Box 232 in the MRI images 218, 220, 222, 226, 228, and 230 indicates an area or region of the left lobe for analysis of the signal. The vARC acquisitions with the LLR reconstruction (i.e., the MRI images 222 and 230) have improved diffusion imaging when compared to the corresponding single shot acquisitions (the MRI images 220 and 228) for both breath hold and respiratory cases utilizing the single channel body coil. The signal-to-noise ratio (as analyzed in box 234) is improved for the vARC acquisitions with the LLR reconstruction (i.e., the MRI images 222 and 230) when compared to the corresponding single shot acquisitions (the MRI images 220 and 228). In addition, the signal in the vARC acquisitions with the LLR reconstruction (i.e., the MRI images 222 and 230) can be recovered despite cardiac motion due to a lower echo train length.

Figure 8:
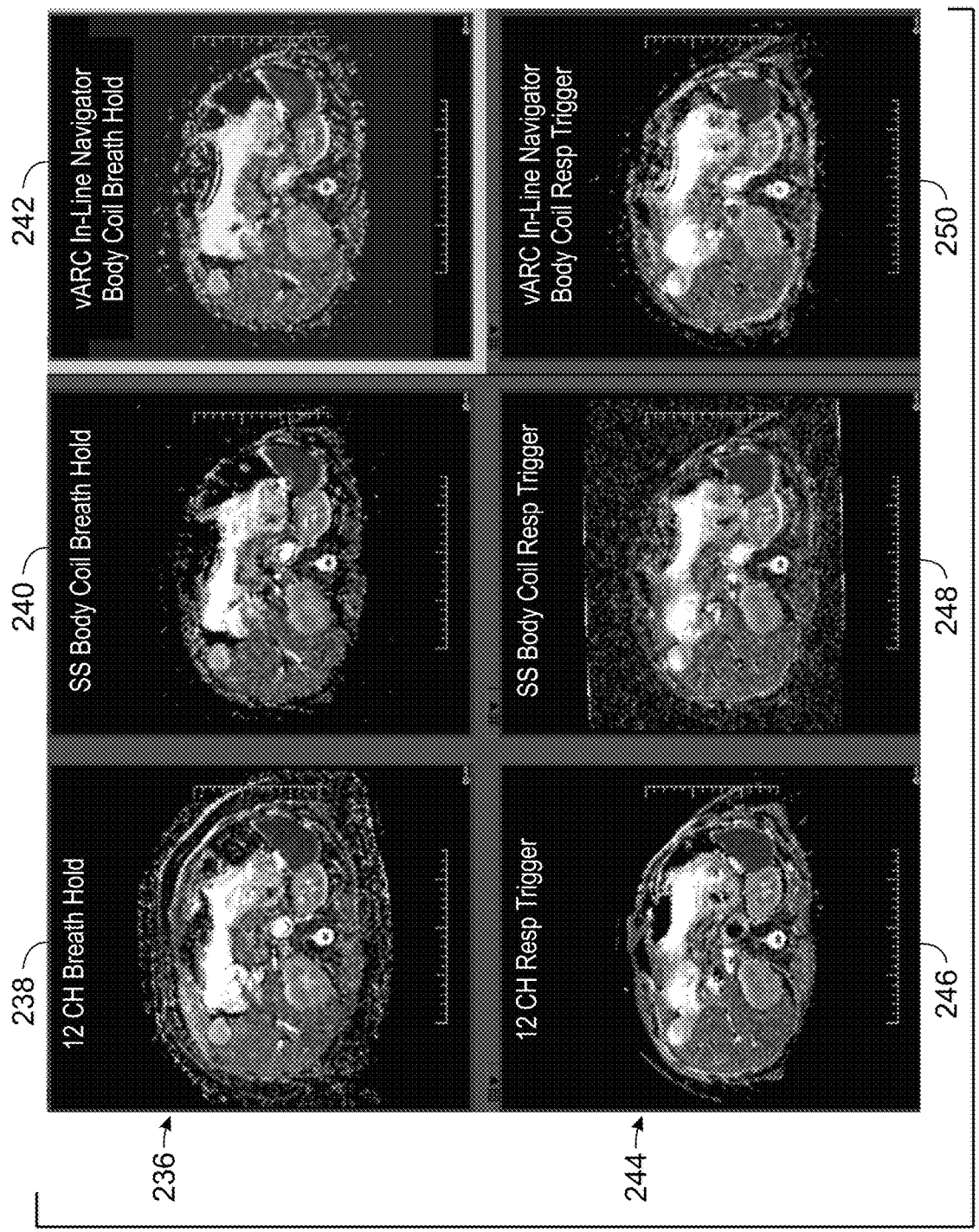
FIG. 8 illustrates apparent diffusion coefficient (ADC) maps of an abdomen of a subject acquired under different techniques including vARC and low rank reconstruction.

FIG. 8 illustrates apparent diffusion coefficient (ADC) maps of an abdomen of a subject (same subject in FIG. 7) acquired under different techniques including vARC and low rank reconstruction. The ADC maps correspond to the MRI images 218, 220, 222, 226, 228, and 230 and were acquired under the same circumstances. A top row 236 includes the ADC maps 238, 240, and 242. A bottom row 244 includes the ADC maps 246, 248, and 250. The ADC maps 238, 240, and 242 correspond to the MRI images 218, 220, and 222 in FIG. 7. The ADC maps 246, 248, and 250 correspond to the MRI images 226, 228, and 230 in FIG. 7. The values of the vARC ADC maps 242, 250 are more uniform (over short T2 anatomies such as the liver) as compared to the values in the single shot ADC maps 240, 248.

Figure 9:
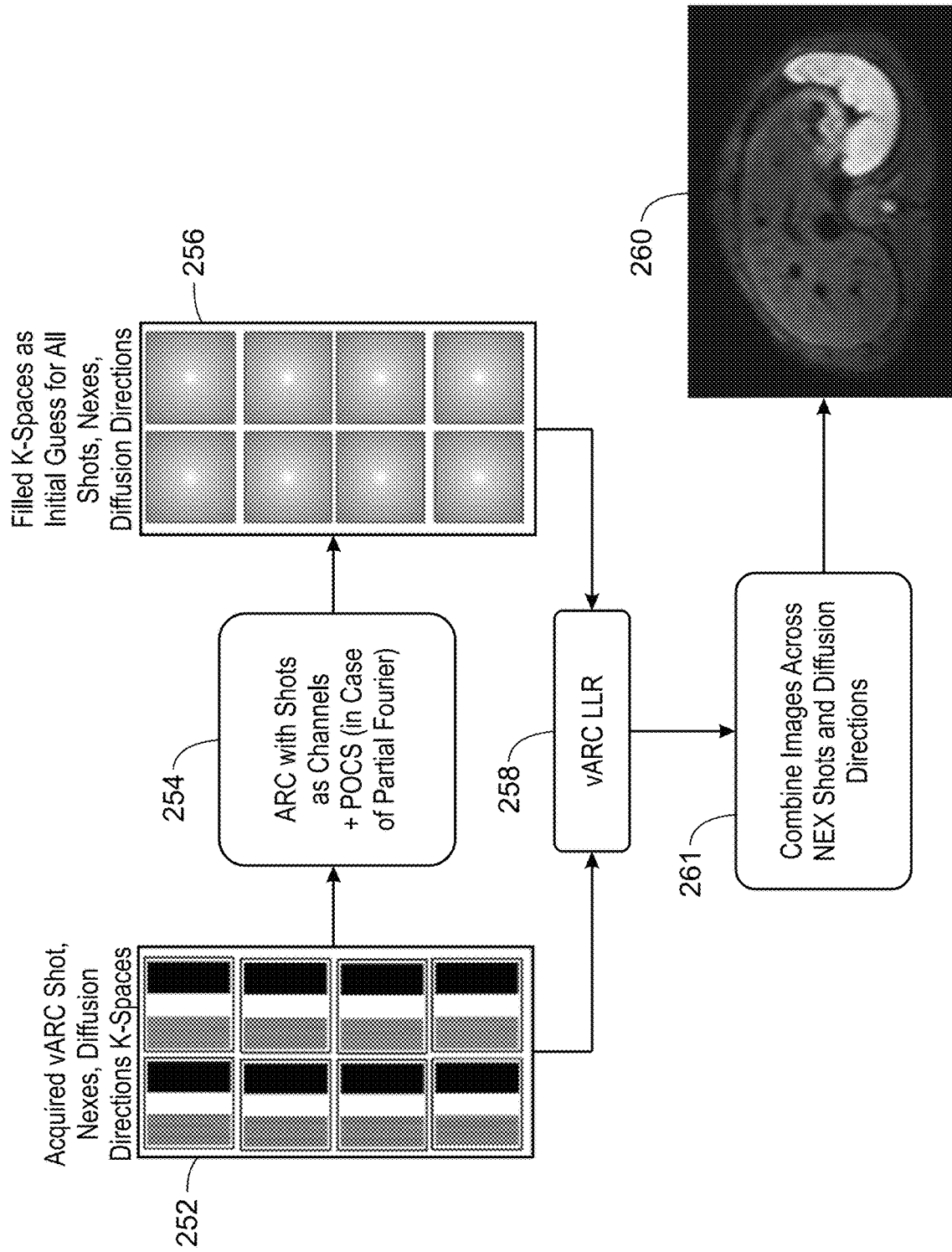
FIG. 9 illustrates a schematic diagram of a modification to the method in FIG. 2, in accordance with aspects of the present disclosure.

FIG. 9 illustrates a schematic diagram of a modification to the method 180 in FIG. 2. As depicted in FIG. 9, k-space data is obtained of a region of interest acquired by an MRI scanner from a single channel body coil (e.g., single channel radio frequency coil disposed about a body of the subject or patient such as RF receiving coil 138 in FIG. 1) utilizing a multi-shot EP-DWI pulse sequence and sampled (e.g., utilizing vARC acquisition) for a plurality of shots 252 so that for each shot 252 of the plurality of shots 252 both a central k-space is fully sampled to form a central calibration region (to server as in-line navigator) and an outer k-space is partially sampled in a phase encoding direction by a factor (e.g., acceleration factor) equal to a number of shots 252 of the plurality of shots 252. The obtaining the k-space data of the region of interest and sampling the k-space data includes obtaining the k-space data and sampling the k-space data over a plurality of excitations or acquisitions in which multiple shots 252 are acquired (as sub-acquisitions) during each excitation and in a plurality of diffusion directions. As depicted in FIG. 9, the shots 252 are derived from the different excitations or acquisitions (nexes) and the plurality of diffusion directions. As depicted in FIG. 9, there are eight shots 252. In certain embodiments, the number of shots 252 may be different (e.g., higher). During sampling of the k-space data for the plurality of shots 252 a subsampling pattern is shifted across the plurality of shots 252. During sampling of the k-space data for the plurality of shots 252 a width of the central calibration region varies across the plurality of shots.

The shots 252 are subjected to reconstruction utilizing partial Fourier constant sampling and ARC and POCS reconstruction (as indicated by reference numeral 254) to generate an initial fully sampled k-space estimate 256 for each shot 252. As depicted in FIG. 9, there are eight initial fully sampled k-space estimates 256 corresponding to the eight shots 252. During reconstruction of the initial fully sampled k-space estimates 256, the plurality of shots 252 (including from the different excitations or acquisitions and the diffusion directions) is treated as a plurality of channels for filling in the missing k-space for a respective shot 252. Interleaved shot k-space is filled with ARC. In ARC, a 3D kernel is utilized to synthesize missing data taking into account neighboring source data from all three directions. The partial Fourier k-space is filled utilizing POCS reconstruction. In certain embodiments, as noted above, a PF factor is greater than the acceleration factor (i.e., the factor required to include the central calibration region). In certain embodiments, reconstructing the initial fully sampled k-space estimate 256 for each shot 252 includes utilizing the central calibration region for a respective shot 252 and a weighted combination of neighboring k-space for the plurality of shots 252 to fill in the missing k-space in the respective shot 252. The central calibration region is utilized to determine weights for the weighted combination for the respective shot 252.

The shots 252 and the initial fully sampled k-space estimates 256 are inputted into a low-rank regularization algorithm 258 (e.g., shot locally low-rank regularization algorithm (shot-LLR)). The low-rank regularization algorithm 258 in an iterative manner generates a reconstructed image for each shot 252. The initial fully sampled k-space estimate 256 for each shot 252 is utilized by the low-rank regularization algorithm 258 as an initial guess.

As depicted in FIG. 9, a diffusion-weighted echo-planar image 260 of the region of interest is generated by combining a plurality of reconstructed images generated by the low-rank regularization algorithm 258 from the plurality of shots 206 over the plurality of excitations and in the plurality of diffusion directions as indicated by reference numeral 261.

Figure 10:
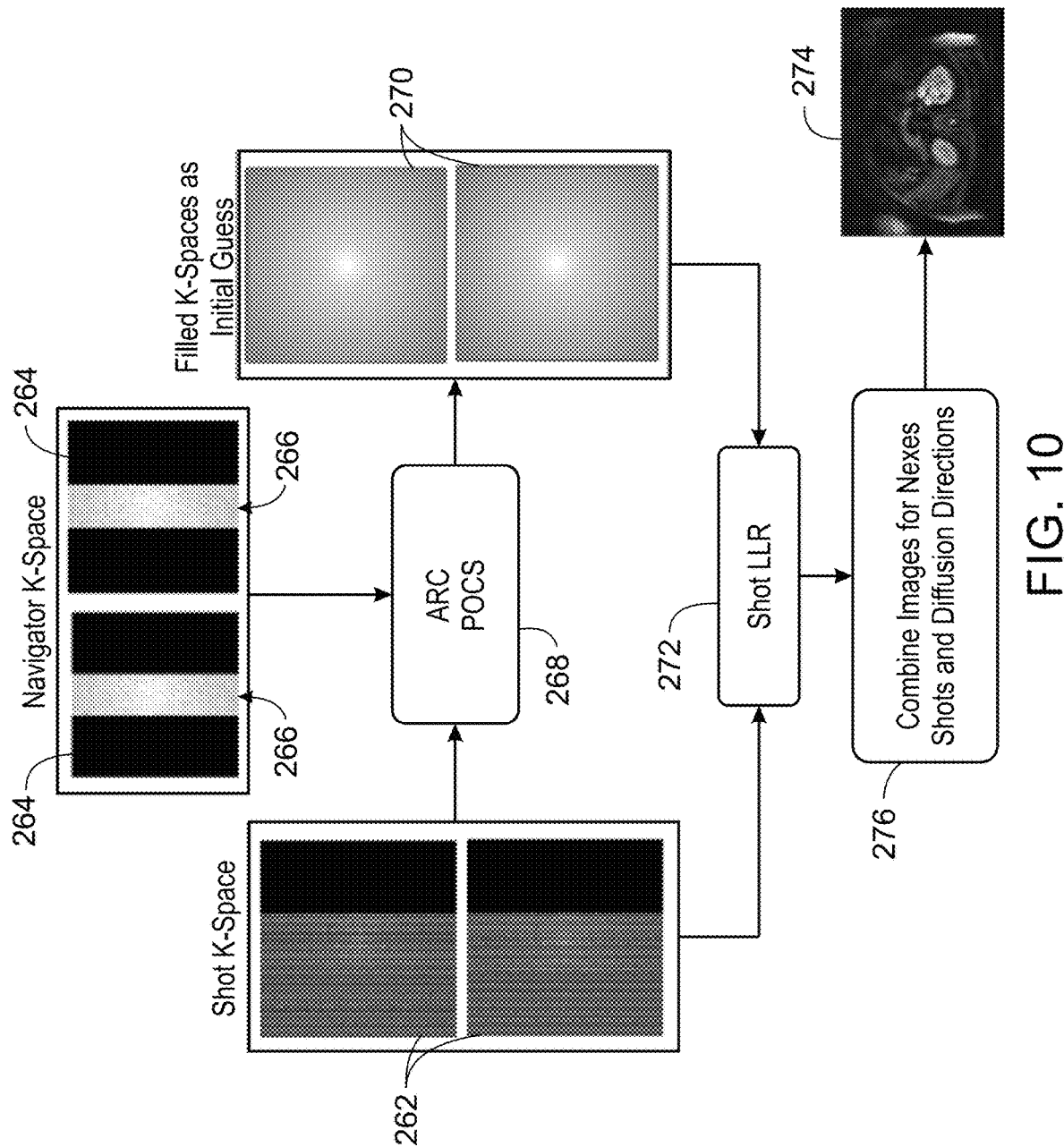
FIG. 10 illustrates a schematic diagram of a method for performing echo-planar diffusion weighted imaging (EP-DWI) (e.g., utilizing a single channel body coil and an external navigator), in accordance with aspects of the present disclosure.

FIG. 10 illustrates a schematic diagram of a method for performing echo-planar diffusion weighted imaging (EP-DWI) (e.g., utilizing a single channel body coil and an external navigator). As depicted in FIG. 10, k-space data is obtained of a region of interest acquired by an MRI scanner from a single channel body coil (e.g., single channel radio frequency coil disposed about a body of the subject or patient such as RF receiving coil 138 in FIG. 1) utilizing a multi-shot EP-DWI pulse sequence and sampled for a plurality of shots 262 so that for each shot 262 of the plurality of shots 262 both a central k-space and an outer k-space are partially sampled in a phase encoding direction. As depicted in FIG. 10, the number of shots 262 is two. During sampling of the k-space data for the plurality of shots 262 a subsampling pattern is shifted across the plurality of shots 262. As noted above, obtaining the k-space data of the region of interest and sampling the k-space data includes obtaining the k-space data and sampling the k-space data over a plurality of excitations or acquisitions in which multiple shots 262 are acquired (as sub-acquisitions) during each excitation and in a plurality of diffusion directions.

As depicted in FIG. 10, external navigators 264 are acquired after a multi-shot pattern acquisition of the shots 262. The external navigators 264 include a sampled central k-space region that serves as a central calibration region 266. In certain embodiments, the external navigators 264 are a gradient echo navigator. In certain embodiments, the external navigators 264 are a spin echo navigator. As depicted, the number of external navigators 264 is two.

The shots 262 are subjected to reconstruction utilizing both autocalibrating for Cartesian imaging (ARC) and POCS reconstruction (as indicated by reference numeral 268) to generate an initial fully sampled k-space estimate 270 for each shot 262. As depicted in FIG. 10, there are two initial fully sampled k-space estimates 270 corresponding to the two shots 262. During reconstruction of the initial fully sampled k-space estimates 270, the plurality of shots 262 is treated as a plurality of channels for filling in the missing k-space for a respective shot 262. Interleaved shot k-space is filled with ARC. In ARC, a 3D kernel is utilized to synthesize missing data taking into account neighboring source data from all three directions. The partial Fourier k-space is filled utilizing POCS reconstruction. In certain embodiments, shots 262 acquired over a plurality of excitations or acquisitions in which multiple shots 262 are acquired (as sub-acquisitions) during each excitation and in a plurality of diffusion directions may also be utilized to fill in the missing k-space for a respective shot. Reconstructing the initial fully sampled k-space estimate 270 for each shot 262 includes utilizing the central calibration region 266 for a respective external navigator 264 and a weighted combination of neighboring k-space for the plurality of shots 262 to fill in the missing k-space in a respective shot 262. The central calibration region 266 is utilized to determine weights for the weighted combination for the respective shot 262. In certain embodiments, initial fully sampled k-space estimates 270 may also be reconstructed for shots 262 acquired over a plurality of excitations or acquisitions and in a plurality of diffusion directions.

The shots 262 and the initial fully sampled k-space estimates 270 are inputted into a low-rank regularization algorithm 272 (e.g., shot locally low-rank regularization algorithm (shot-LLR)). The low-rank regularization algorithm 272 in an iterative manner generates a reconstructed image for each shot 262. The initial fully sampled k-space estimate 270 for each shot 260 is utilized by the low-rank regularization algorithm 272 as an initial guess.

As depicted in FIG. 10, a diffusion-weighted echo-planar image 274 of the region of interest is generated by combining a plurality of reconstructed images generated by the low-rank regularization algorithm 272 from the plurality of shots 262 over the plurality of excitations and in the plurality of diffusion directions as indicated by reference numeral 276.

In certain embodiments, the same vARC technique described above could be used for multi-channel acquisition as well. In certain embodiments, the same technique could be used for applications (other than diffusion) like function MRI and echo planar based acquisitions where signal can be gained through the sampling pattern.

Technical effects of the disclosed subject matter include providing vARC sampling in single channel diffusion weighted imaging acquisition. The vARC sampling reduces distortion due to subsampled k-space acquisition and improves signal-to-noise ratio (via reduction in time to echo (TE) when the central calibration region is smaller than the partial Fourier sampling region). The vARC sampling also enables multi-shot data combination without aliasing due to the fully sampled central k-space. The vARC sampling is robust due to the outer subsampling pattern being shifted across shots. Also, vARC image reconstruction along with the shot low-rank regularization module operates at a smaller matrix size and produces good quality images where typical low-rank regularization methods cannot be applied due to random matrix theory related approximations. Further, vARC can be utilized with produce reverse polarity gradient (RPG) to further reduce distortion.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for performing echo-planar diffusion weighted imaging (EP-DWI), comprising:
   obtaining, via a processor, k-space data of a region of interest acquired by a magnetic resonance imaging (MRI) scanner from a single channel body coil utilizing a multi-shot EP-DWI pulse sequence;
   sampling, via the processor, the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI;
   reconstructing, via the processor, an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction; and
   utilizing, via the processor, a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

2. A system for performing echo-planar diffusion weighted imaging (EP-DWI), comprising:
   a memory encoding processor-executable routines; and
   a processor configured to access the memory and to execute the processor-executable routines, wherein the processor-executable routines, when executed by the processor, cause the processor to:
   obtain k-space data of a region of interest acquired by a magnetic resonance imaging (MRI) scanner from a single channel body coil utilizing a multi-shot EP-DWI pulse sequence;
   sample the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI;
   reconstruct an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction; and
   utilize a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

3. A non-transitory computer-readable medium, the computer-readable medium comprising processor-executable code that when executed by a processor, causes the processor to:
   obtain k-space data of a region of interest acquired by a magnetic resonance imaging (MRI) scanner from a single channel body coil utilizing a multi-shot echo-planar diffusion weighted imaging (EP-DWI) pulse sequence;
   sample the k-space data for a plurality of shots so that for each shot of the plurality of shots both a central k-space is fully sampled to form a central calibration region and an outer k-space is partially sampled in a phase encoding direction by a factor equal to a number of shots of the plurality of shots, wherein during sampling of the k-space data for the plurality of shots a width of the central calibration region varies across the plurality of shots to control distortion levels in the EP-DWI;
   reconstruct an initial fully sampled k-space estimate for each shot of the plurality of shots utilizing partial Fourier constant sampling and both autocalibrating reconstruction for Cartesian imaging (ARC) and projection on convex sets (POCS) reconstruction, wherein the plurality of shots is treated as a plurality of channels for filling in missing k-space for a respective shot, and wherein interleaved shot-space is filled with ARC and partial k-space is filled with POCS reconstruction; and
   utilize a low-rank regularization algorithm in an iterative manner to generate a reconstructed image for each shot of the plurality of shots, wherein the initial fully sampled k-space estimate for each shot of the plurality of shots is utilized by the low-rank regularization algorithm as an initial guess.

4. The computer-implemented method of claim 1, wherein reconstructing the initial fully sampled k-space estimate for each shot comprises utilizing the central calibration region for a respective shot and a weighted combination of neighboring k-space for the plurality of shots to fill in missing k-space in the respective shot.

5. The computer-implemented method of claim 1, wherein during sampling of the k-space data for the plurality of shots a subsampling pattern is shifted across the plurality of shots.

6. The computer-implemented method of claim 1, wherein a partial Fourier factor is greater than the factor.

7. The computer-implemented method of claim 1, wherein obtaining the k-space data of the region of interest and sampling the k-space data comprises obtaining the k-space data and sampling the k-space data over a plurality of excitations and in a plurality of diffusion directions.

8. The system of claim 2, wherein reconstructing the initial fully sampled k-space estimate for each shot comprises utilizing the central calibration region for a respective shot and a weighted combination of neighboring k-space for the plurality of shots to fill in missing k-space in the respective shot.

9. The system of claim 2, wherein during sampling of the k-space data for the plurality of shots a subsampling pattern is shifted across the plurality of shots.

10. The system of claim 2, wherein a partial Fourier factor is greater than the factor.

11. The system of claim 2, wherein obtaining the k-space data of the region of interest and sampling the k-space data comprises obtaining the k-space data and sampling the k-space data over a plurality of excitations and in a plurality of diffusion directions.

12. The non-transitory computer-readable medium of claim 3, wherein during sampling of the k-space data for the plurality of shots a subsampling pattern is shifted across the plurality of shots.

13. The non-transitory computer-readable medium of claim 3, wherein obtaining the k-space data of the region of interest and sampling the k-space data comprises obtaining the k-space data and sampling the k-space data over a plurality of excitations and in a plurality of diffusion directions.

14. The non-transitory computer-readable medium of claim 3, wherein reconstructing the initial fully sampled k-space estimate for each shot comprises utilizing the central calibration region for a respective shot and a weighted combination of neighboring k-space for the plurality of shots to fill in missing k-space in the respective shot.

15. The non-transitory computer-readable medium of claim 3, wherein reconstructing the initial fully sampled k-space estimate for each shot comprises utilizing central calibration regions from either gradient echo navigators or spin echo navigators and a weighted combination of neighboring k-space for the plurality of shots to fill in missing k-space in the respective shot, wherein the gradient echo navigators or the spin echo navigators were acquired subsequent to the acquisition of the k-space data utilizing the EP-DWI pulse sequence.

16. The computer-implemented method of claim 4, wherein reconstructing the initial fully sampled k-space estimate for each shot comprises utilizing the central calibration region to determine weights for the weighted combination for the respective shot.

17. The computer-implemented method of claim 7, further comprising generating, via the processor, a diffusion-weighted echo-planar image for the region of interest by combining a plurality of reconstructed images generated by the low-rank regularization algorithm from the plurality of shots over the plurality of excitations and in the plurality of diffusion directions.

18. The system of claim 8, wherein reconstructing the initial fully sampled k-space estimate for each shot comprises utilizing the central calibration region to determine weights for the weighted combination for the respective shot.

19. The system of claim 11, wherein the processor-executable routines, when executed by the processor, cause the processor to generate a diffusion-weighted echo-planar image for the region of interest by combining a plurality of reconstructed images generated by the low-rank regularization algorithm from the plurality of shots over the plurality of excitations and in the plurality of diffusion directions.

20. The non-transitory computer-readable medium of claim 13, wherein the processor-executable code, when executed by the processor, cause the processor to generate a diffusion-weighted echo-planar image for the region of interest by combining a plurality of reconstructed images generated by the low-rank regularization algorithm from the plurality of shots over the plurality of excitations and in the plurality of diffusion directions.

* * * * *